(12) United States Patent
Tong

(10) Patent No.: US 7,423,882 B1
(45) Date of Patent: Sep. 9, 2008

(54) ROTATING CLIP

(75) Inventor: Ryan C. Tong, Palo Alto, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 11/765,384

(22) Filed: Jun. 19, 2007

(51) Int. Cl.
*H05K 7/20* (2006.01)
*F28D 15/00* (2006.01)

(52) U.S. Cl. .............. 361/719; 361/704; 361/709; 165/104.33; 165/185; 174/16.3; 248/510

(58) Field of Classification Search .............. 361/704, 361/709–710, 719; 165/104.33, 185; 174/16.3; 248/505, 510
See application file for complete search history.

(56) References Cited

U.S. PATENT DOCUMENTS 6,282,093 B1 *  8/2001  Goodwin ............... 361/704
7,190,586 B2 *  3/2007  Franz et al. ............ 361/704

* cited by examiner

*Primary Examiner*—Jayprakash N Gandhi
*Assistant Examiner*—Robert J Hoffberg
(74) *Attorney, Agent, or Firm*—Patterson & Sheridan, LLP

(57) ABSTRACT

Apparatus and methods for mounting of a cooling device coupled to a circuit board include use of a clip that is rotated to mate with and engage the cooling device. Rotation of the clip occurs during installation of the cooling device and slides slots in the clip into interconnection with respective protrusions of the cooling device extending through the circuit board to where the clip is disposed. In an assembled configuration, the clip biases the cooling device to a processing unit coupled to the circuit board on an opposite side from the clip.

19 Claims, 6 Drawing Sheets

ROTATING CLIP

BACKGROUND OF THE INVENTION

1. Field of the Invention

Embodiments of the invention generally relate to coupling a cooling device to a circuit board for dissipating heat from a processing unit, such as a graphics processing unit, mounted to the circuit board.

2. Description of the Related Art

A computer system operates using processors coupled to circuit boards. For example, a graphics processing unit (GPU) offers dedicated graphics rendering capabilities to the system. The GPU may sit on top of a circuit board to form a graphics card or video card disposed within the system. In order to remove heat generated by the GPU during operation, a heat removal device that often includes a heat sink formed with heat dissipating protrusions is oftentimes coupled to the GPU so that heat can be transferred from the GPU to the heat sink and dissipated.

In many designs, a preset amount of load, forcing the heat sink against the GPU, helps achieve thermal transfer from the GPU to the heat sink. The load avoids potential for air gaps between the heat sink and the GPU without causing damage to the GPU from excess force. In certain designs, a helical spring around each attachment screw or a v-clip disposed on an opposite side of the circuit board from the GPU attaches at least two points on the heat sink to the circuit board. Such attachments control the load induced on the GPU.

However, the above approach has definite drawbacks. First, during assembly, each screw must be sequentially screwed into the heat sink at each of the attachment points. This process is a time consuming and inefficient and can be difficult for users. Second, the v-clip must be attached one side at a time. When installing the first side, the v-clip both deflects and rotates. Because of the deflection, installing the second side of the v-clip however requires more force and, hence, work compared to installing the first side. Specifically, the v-clip must, without rotation, deflect through a larger angle and, thus, greater distance since the first side is already being held in place by an attachment screw. In addition, the increased resistance from the v-clip makes screwing down the attachment screws on the second side of the v-clip more difficult.

Therefore, there exists a need for apparatus and methods to improve attaching of cooling devices to processors, such as GPUs, on circuit boards.

SUMMARY OF THE INVENTION

According to one embodiment of the invention, an electronics card assembly includes a printed circuit board and a processing unit attached to a front side of the circuit board. A cooling system couples to the circuit board with the processing unit disposed between the circuit board and part of the cooling system. The cooling system includes first and second shafts that each pass through the circuit board and have an outward facing shoulder disposed on a back side of the circuit board. A clip includes first and second slots respectively into sides of first and second arms of the clip. Location of the first and second slots enables rotation of the clip to position the first and second shafts respectively within the first and second slots that are sized for the clip to retain the outward facing shoulders.

A method of attaching a cooling system on an electronics card assembly in one embodiment includes providing a printed circuit board with a processing unit attached to a front side of the circuit board. The method further includes locating the cooling system to position the processing unit between the circuit board and part of the cooling system with first and second shafts of the cooling system passing through the circuit board. Rotating a clip on the back side of the circuit board interconnects the clip with the first and second shafts.

For one embodiment, a method attaches a cooling system on an electronics card assembly. The method includes providing a printed circuit board with a processing unit attached to the circuit board. Attaching a cooling system to the circuit board includes rotating a clip into retaining engagement with multiple spaced portions of the cooling system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally relate to mounting of a cooling device on a circuit board. The cooling device couples to the circuit board via a clip that is rotated to mate with and engage the cooling device. Rotation of the clip occurs during installation of the cooling device and slides slots in the clip into interconnection with respective protrusions of the cooling device extending through the circuit board to where the clip is disposed. In an assembled configuration, the clip biases the cooling device to a processing unit coupled to the circuit board on an opposite side from the clip.

Figure 1:
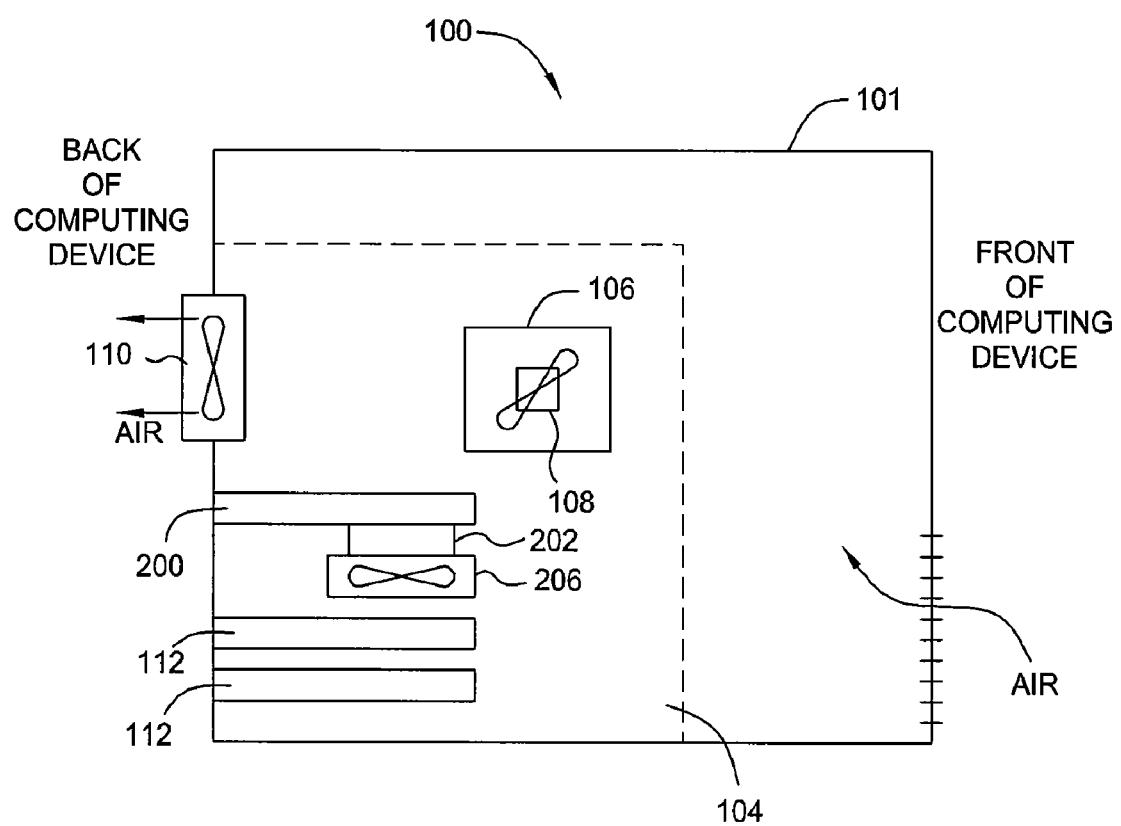
FIG. 1 is a schematic diagram illustrating a computing device employing a graphics card, in accordance with various embodiments of the invention.

FIG. 1 illustrates an exemplary computer 100, such as a desktop, laptop, server, mainframe, set-top box, cellular phone, or personal digital assistant (PDA). As shown, the computer 100 includes a housing 101, within which a motherboard 104 resides. A central processing unit (CPU) 106, a processor cooler 108 for cooling the CPU 106, and one or more peripheral component interface (PCI) cards 112, each interfaced with a slot located in the back part of the housing 101, all mount on the motherboard 104. A system fan 110 attaches to the housing 101 for removing heat from the computer 100. The motherboard 104 further incorporates a graphics card 200 configured as described further herein. The graphics card 200 enables the computing device 100 to rapidly process graphics related data for graphics intensive applications such as gaming applications. The graphics card 200 includes a printed circuit board (PCB) 201 (shown in FIG. 2) upon which a plurality of circuit components, such as memory chips, is mounted. In addition, the graphics card 200 includes a GPU 202, mounted to a front of the circuit board 201, for processing graphics related data and the like and a cooling system 206 (e.g., a fan, dissipating fins and intervening heat sink) for cooling the GPU 202.

Figure 2:
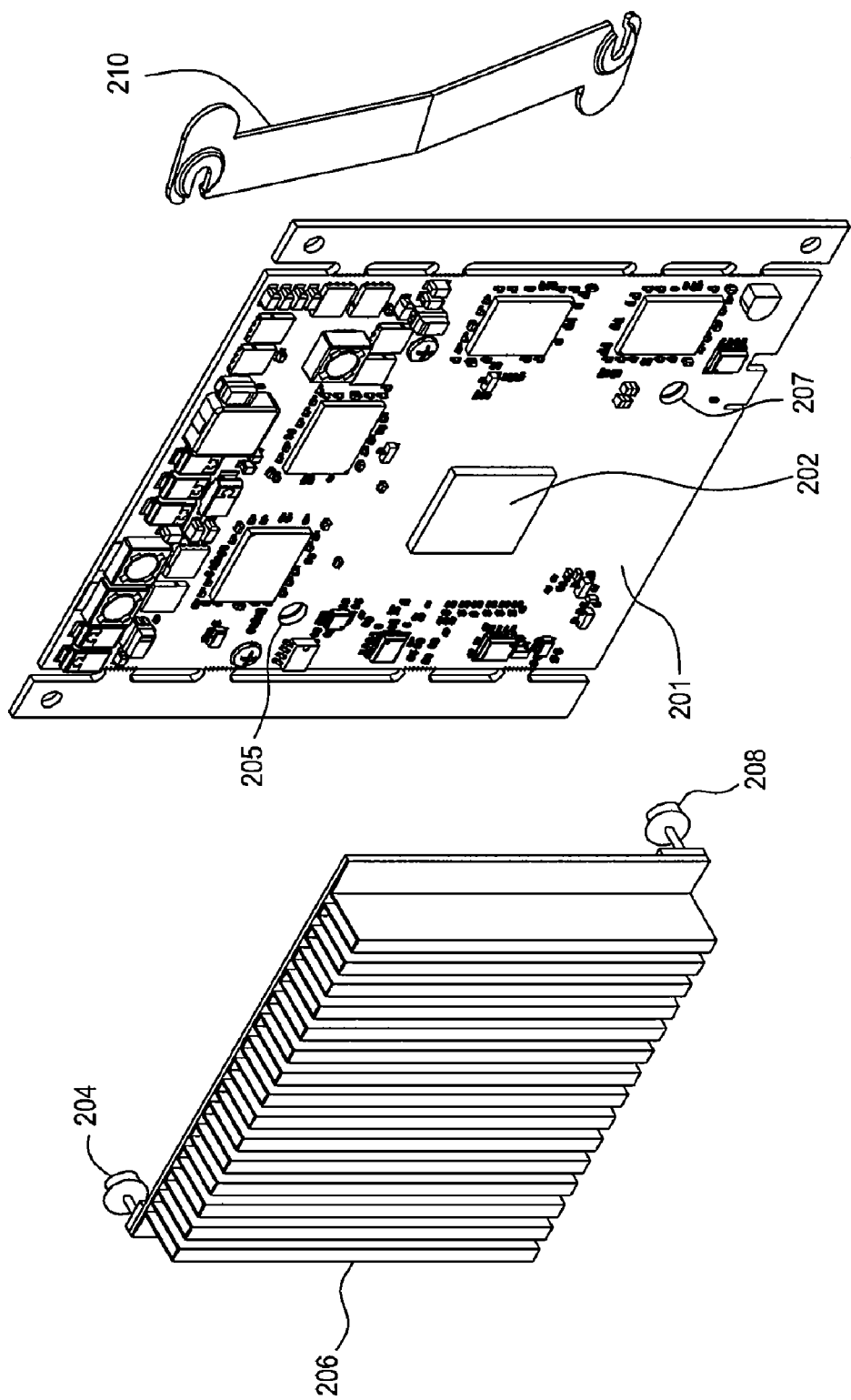
FIG. 2 is an exploded isometric view of the graphics card with a heat sink, a circuit board and a heat sink biasing clip configured to engage and mate with the heat sink by rotation of the clip, according to one embodiment of the invention.
Figure 4:
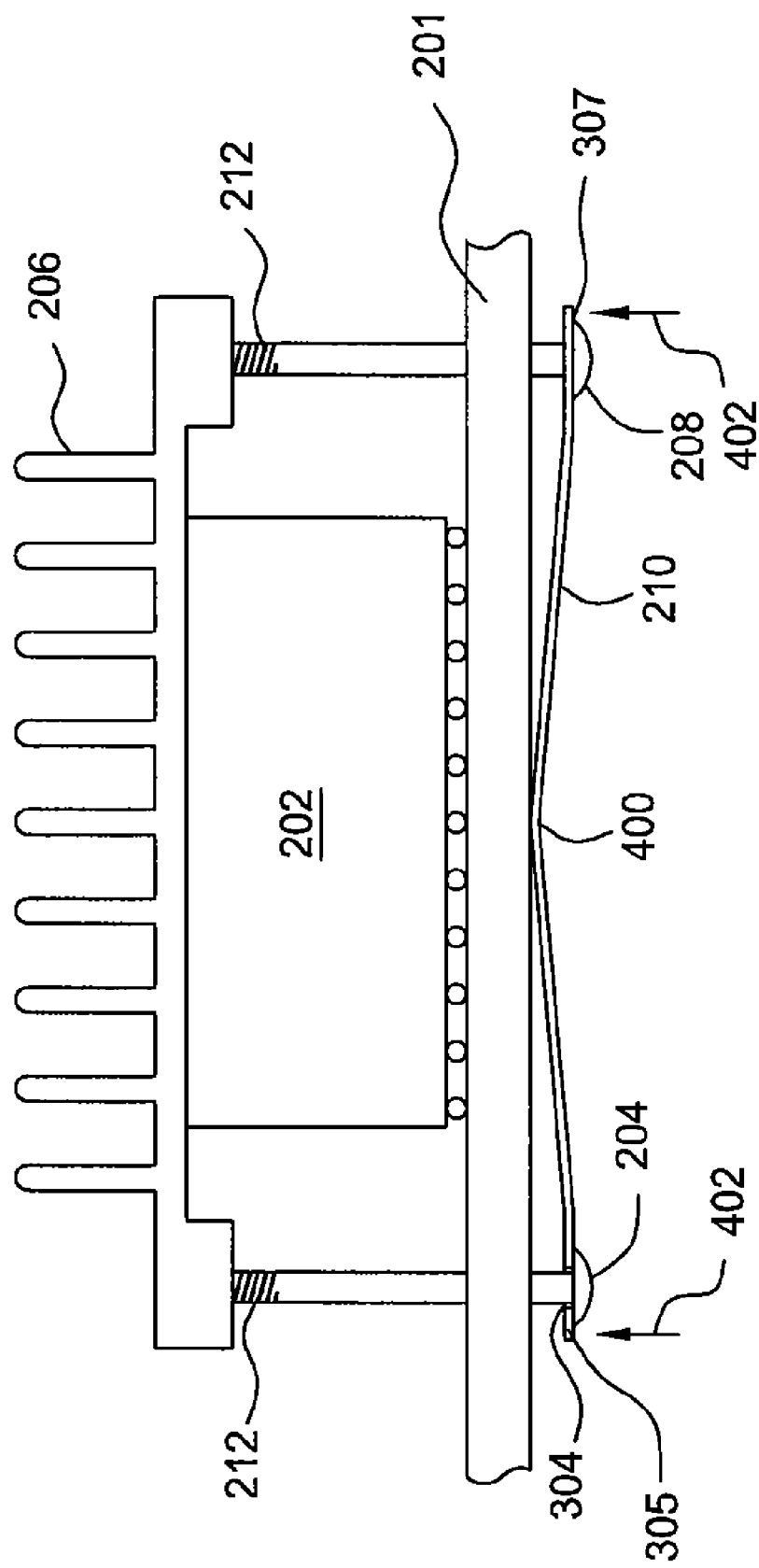
FIG. 4 is a side view of a portion of the graphics card with the clip biasing the heat sink against a GPU disposed on a front of the circuit board.

FIG. 2 shows the graphics card 200 with the cooling system 206 (fan not shown), the circuit board 201 and a heat sink biasing clip 210, each being separated from one another for illustration purposes and for depicting an exemplary preassembly position prior to bringing the cooling system 206, the circuit board 201, and the clip 210 together as discussed herein. For example, an end user replacing the cooling system 206 or an original equipment manufacturer assembler utilizes the clip 210 to install the cooling system 206. The clip 210, as explained further herein, couples the cooling system 206 to the circuit board 201 while urging the cooling system 206 against the GPU 202. FIGS. 2 and 4 show the graphics card 200 with the cooling system 206 depicted as a fin type heat sink as an example.

First and second apertures 205, 207 through the circuit board 201 align with corresponding protrusions, such as headed first and second screws 204, 208, extending from the cooling system 206 adjacent to where the cooling system 206 interfaces with the GPU 202. In some embodiments, pins with knob ends (see FIG. 6) form the protrusions that may be integral with the cooling system 206. Positions of the first and second apertures 205, 207 through the circuit board 201 may align with a diagonal through the GPU 202 or be disposed at any other location suitable to stabilize the cooling system 206 once attached. When the cooling system 206 rests against the GPU 202, the screws 204, 208 pass respectively through the apertures 205, 207 to a back of the circuit board 201.

Figure 3:
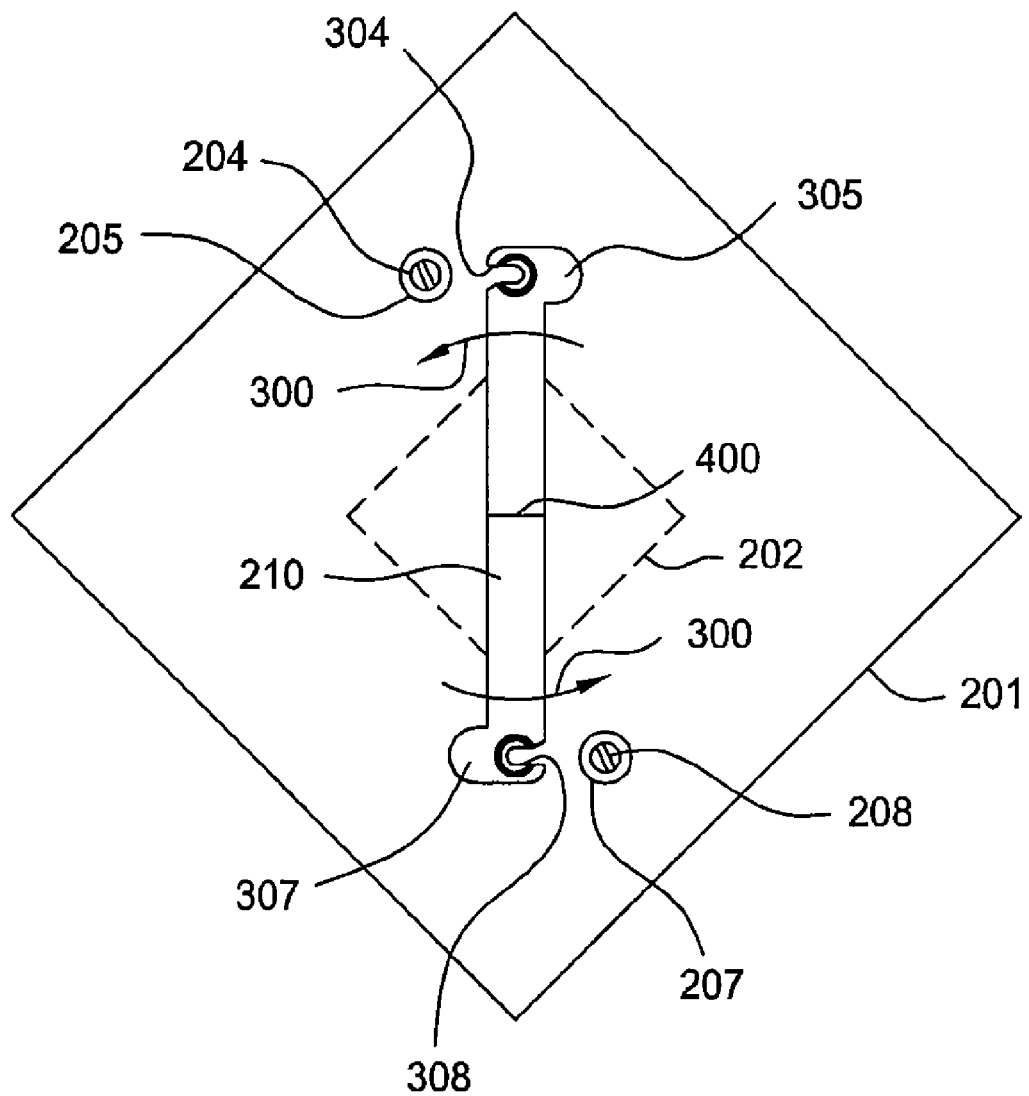
FIG. 3 is a back view of a portion of the circuit board illustrating rotation of the clip during installation of the heat sink, according to one embodiment of the invention.

FIG. 3 illustrates the back of the circuit board 201 with the screws 204, 208 in position through the apertures 205, 207 but prior to engagement with the clip 210. As represented by rotational arrows 300, an installer rotates the clip 210 to interconnect first and second slots 304, 308 in the clip 210 respectively with the first and second screws 204, 208. A distance between the first and second slots 304, 308 matches a distance between the first and second screws 204, 208. The rotation of the clip 210 causes the clip 210 to simultaneous interconnect with both of the screws 204, 208 without requiring a series of steps to interconnect the clip 210 to the first screw 204 and then the second screw 208. Further, the first and second slots 304, 308 inner dimensions and distal positions on respective first and second arms 305, 307 of the clip 210 along with a shape of the clip 210 as shown in FIG. 4 retain the screws 204, 208 and maintain the clip 210 in position once installed.

FIG. 4 illustrates a side view of a portion of the graphics card 200 with the clip 210 biasing the cooling system 206 against the GPU 202 that attaches and electrically couples to the front of the circuit board 201. Because the computational requirements of the GPU 202 can be substantial, the GPU 202 tends to generate a large amount of heat during operation. If the generated heat is not properly dissipated, performance of the GPU 202 degrades. For this reason, the cooling system 206 that is configured to remove heat from the GPU 202 may be coupled to a top surface of the GPU 202 by direct contact with a bottom surface of the cooling system 206 for thermal transfer.

With reference to FIGS. 3 and 4, each of the slots 304, 308 interfaces with a shaft section of the screws 204, 208 between the back of the circuit board 201 and enlarged diameter head sections of the screws 204, 208, which are larger than the inner dimension of the slots 304, 308. The arms 305, 307 of the clip 210 extend at an angle from a central vertex 400 to form a v-shape. The clip 210 contacts the back of the circuit board 201 at the central vertex 400 with the arms 305, 307 inclined outward to increase space between the arms 305, 307 and the circuit board 201. If viewed from the central vertex 400 toward the distal end of each of the arms 305, 307, each of the slots 304, 308 cuts into a left side of the arms 305, 307 when configured for counter-clockwise assembly rotation as depicted by the rotational arrows 300, but may cut into a right side for clockwise configurations. While rotating the clip 210 into position, the installer presses the arms 305, 307 toward the back of the circuit board 201 as represented by deflection arrows 402 so that the slots 304, 308 align between the back of the circuit board 201 and the enlarged diameter head section of the screws 204, 208.

Pressing the arms 305, 307 toward the back of the circuit board 201 causes both arms 305, 307 to deflect together in a symmetrical manner relative to the central vertex 400. Spring force of the clip 210 urging the distal ends of the arms 305, 307 against the screws 204, 208 prevents back rotation of the clip 210 after the clip 210 is installed and force shown by the deflection arrows 402 is removed. Further, the slots 304, 308 may define a recessed profile visible in FIG. 3 to facilitate retaining of the enlarged diameter head section of the screws 204, 208 and thereby inhibit the back rotation of the clip 210.

Material of the clip 210 permits elastic shape changes of the clip 210. The shape changes and elastic recovery accommodate flattening of the v-shape to enable assembly and desired loading of the cooling system 206 against the GPU 202. For some embodiments, a metal of sufficient thinness and type to permit the installer to flex the clip 210 as described heretofore forms the clip 210.

The height of the screws 204, 208 protruding from the back of the circuit board 201 may be adjustable or fixed. Threads 212 along a length of the screws 204, 208 connect by threaded engagement within the cooling system 206. Rotation of the screws 204, 208 translates the screws 204, 208 in a linear direction relative to the cooling system 206 to adjust the height. In some embodiments, the screws 204, 208 may be, prior to attaching the clip 210, preinstalled to a determined height selected to flex the clip 210 an identified amount once the clip 210 is installed. Even if the screws 204, 208 are preinstalled prior to rotating the clip 210 into engagement with the screws 204, 208 to partially load the clip 210, additional fine adjusting of the screws 204, 208 may further load the clip 210 or relieve some flexure of the clip 210 depending on if the screws are loosened or tightened while the clip 210 and the screws 204, 208 are engaged.

Figure 5:
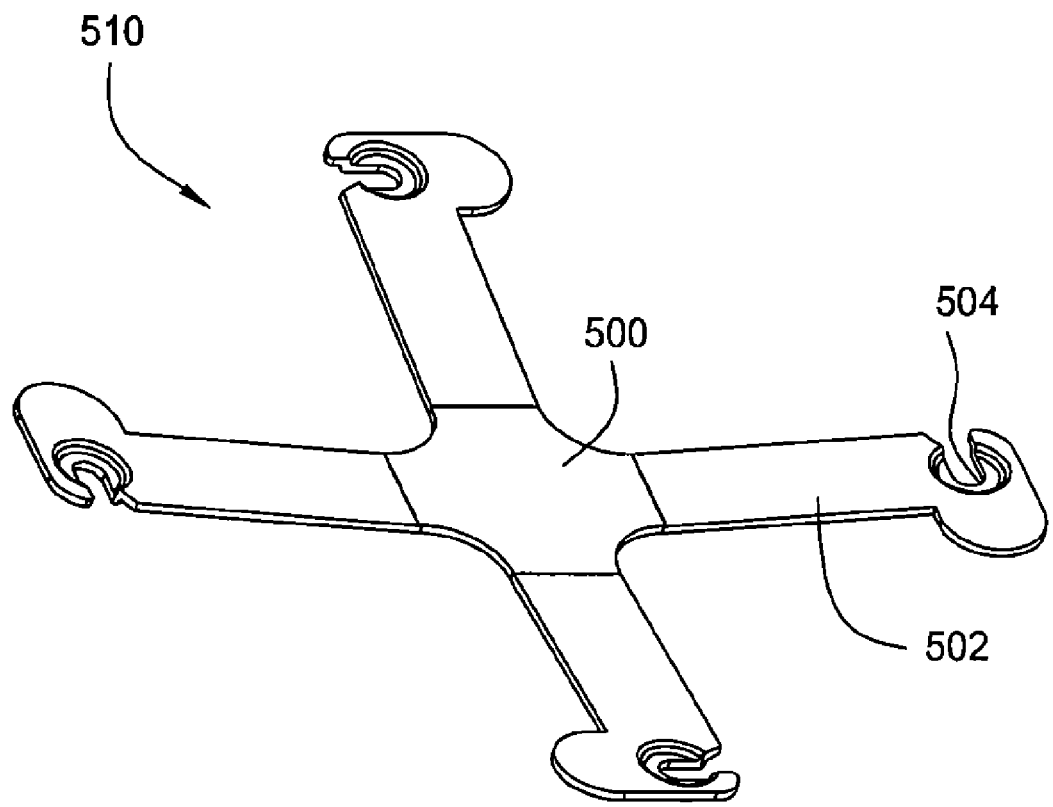
FIG. 5 is an isometric view of a four-mount clip, according to one embodiment of the invention.

FIG. 5 shows a four-mount clip 510 that includes four extensions 502 bent near a central hub 500 of the four extensions 502 in a common direction. The four-mount clip includes slots 504 into sides of the extensions 502 distal from the central hub 500. The four-mount clip 510 functions and is installed analogous to the foregoing description relating to securing at one time only two points instead of four points of the cooling system 206.

Figure 6:
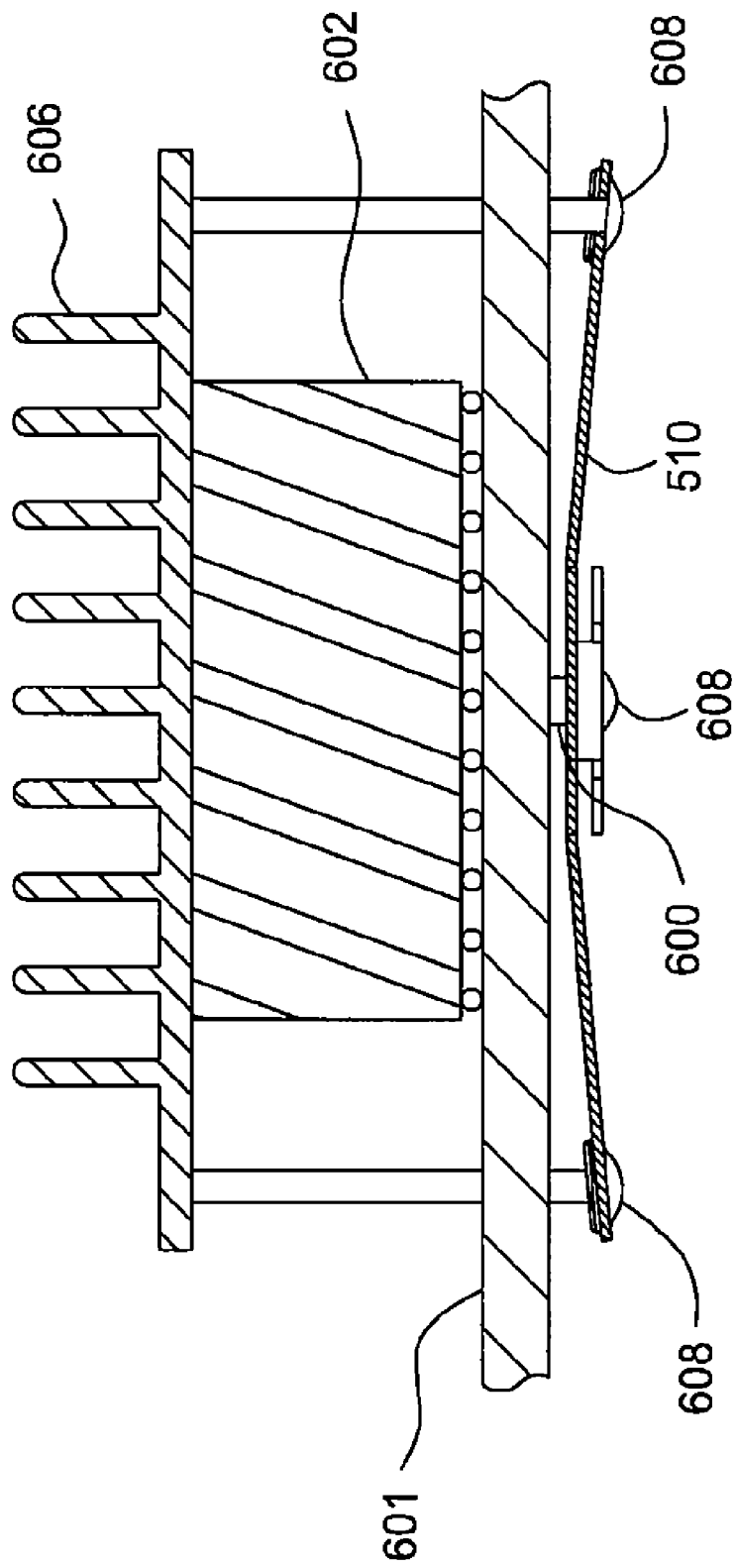
FIG. 6 is a section view, offset from a center-line, of the four-mount clip in use, according to one embodiment of the invention.

FIG. 6 illustrates the clip 510 in use biasing a heat sink 606 against a GPU 602. To position the four-mount clip 510 aligned with each of four pins 608 extending through a circuit board 601 and affixed to the heat sink 606, the installer presses on all of the four extensions 502 together and rotates the clip 510 into place. Releasing the clip 510 then acts to pull the heat sink 606 toward the GPU 602 with recovery of the clip 510 that is limited by interference around the slots 504 provided by shoulder contact of the pins 608 with the clip 510. The clip 510 includes a foot 600 pressed against the circuit board 601 by spring force of the clip 510. The foot 600 further provides a pivot for rotation of the clip 510 when interconnecting the clip 510 to the pins 608.

Teachings described herein extend to any processing unit attached to a circuit board, as exemplified by applications where the processing unit may specifically be a GPU. While the foregoing is directed to embodiments of the present invention, other and further embodiments of the invention may be devised without departing from the basic scope thereof, and the scope thereof is determined by the claims that follow.

What is claimed is:

1. An electronics card assembly, comprising:
   a printed circuit board;
   a processing unit attached to a front side of the circuit board;
   a cooling system coupled to the circuit board with the processing unit disposed between the circuit board and part of the cooling system, wherein the cooling system includes first and second shafts that each pass through the circuit board and have an outward facing shoulder disposed on a back side of the circuit board; and
   a clip having a peripheral edge having first and second slots respectively into sides of first and second arms of the clip, the slots extending to the peripheral edge wherein location of the first and second slots enables rotation of the clip to position the first and second shafts respectively within the first and second slots that are sized for the clip to retain the outward facing shoulders.

2. The electronics card assembly of claim 1, wherein third and fourth slots respectively in third and fourth arms of the clip and extending to the peripheral edge of the clip enable the rotation of the clip to position third and fourth shafts of the cooling system respectively within the third and fourth slots.

3. The electronics card assembly of claim 1, wherein the shafts extend a permanent fixed length.

4. The electronics card assembly of claim 1, wherein threads along a length of the shafts connect by threaded engagement within the cooling system.

5. The electronics card assembly of claim 1, wherein the processing unit comprises a graphics processing unit.

6. The electronics card assembly of claim 1, wherein the cooling system includes a heat sink in contact with the processing unit.

7. The electronics card assembly of claim 1, wherein the arms extend, from a portion of the clip contacting the circuit board, at an angle away from the circuit board.

8. The electronics card assembly of claim 1, wherein a spring force from deflection of the clip biases the cooling system against the processing unit.

9. A method of attaching a cooling system on an electronics card assembly, comprising:
   providing a printed circuit board with a processing unit attached to a front side of the circuit board;
   locating the cooling system to position the processing unit between the circuit board and part of the cooling system with first and second shafts of the cooling system passing through the circuit board and having an outward facing shoulder disposed on a back side of the circuit board;
   rotating a clip on the back side of the circuit board to interconnect with the first and second shafts, the clip having a peripheral edge having first and second slots respectively into sides of first and second arms of the clip, the slots extending to the peripheral edge wherein location of the first and second slots enables rotation of the clip to position the first and second shafts respectively within the first and second slots that are sized for the clip to retain the outward facing shoulders; and
   wherein the rotation passes the shafts through the edge of the clip and positions the first and second shafts respectively within first and second slots respectively into sides of first and second arms of the clip.

10. The method of claim 9, wherein the rotating interconnects the clip simultaneously with the first and second shafts.

11. The method of claim 9, further comprising pressing the clip toward the circuit board against elastic flexure of the clip during the rotating and then releasing the clip to retain outward facing shoulders of the shafts with the clip.

12. The method of claim 11, wherein the releasing of the clip urges the cooling system into contact with the processing unit.

13. The method of claim 9, further comprising rotating the shafts to adjust a load forcing the cooling system against the processing unit.

14. The method of claim 9, wherein the shafts are connected to the cooling system prior to rotating the clip.

15. A method of attaching a cooling system on an electronics card assembly, comprising:
    providing a printed circuit board with a processing unit attached to the circuit board;
    attaching a cooling system with first and second shafts of the cooling system passing through the circuit board and having an outward facing shoulder disposed on a back side of the circuit board to the circuit board by rotating a clip into retaining engagement with multiple spaced portions of the cooling system, the clip having a peripheral edge having first and second slots respectively into sides of first and second arms of the clip, the slots extending to the peripheral edge wherein location of the first and second slots enables rotation of the clip to position the first and second shafts respectively within the first and second slots that are sized for the clip to retain the outward facing shoulders; and
    wherein the rotation passes the shafts through the edge of the clip and positions the first and second shafts respectively within first and second slots respectively into sides of first and second arms of the clip.

16. The method of claim 15, wherein the rotating interconnects the clip simultaneously with two spaced portions of the cooling system.

17. The method of claim 15, wherein the rotating interconnects the clip simultaneously with four spaced portions of the cooling system.

18. The method of claim 15, further comprising deflecting the clip against elastic flexure of the clip during the rotating and then releasing the clip into the retaining engagement.

19. The method of claim 15, wherein the retaining engagement biases the cooling system against the processing unit.

* * * * *